(12) United States Patent
King

(10) Patent No.: US 6,861,707 B1
(45) Date of Patent: Mar. 1, 2005

(54) NEGATIVE DIFFERENTIAL RESISTANCE (NDR) MEMORY CELL WITH REDUCED SOFT ERROR RATE

(75) Inventor: Tsu-Jae King, Fremont, CA (US)

(73) Assignee: Progressant Technologies, Inc., Fremont, CA (US)

(*) Notice: Subject to any disclaimer, the term of this patent is extended or adjusted under 35 U.S.C. 154(b) by 0 days.

(21) Appl. No.: 10/831,950

(22) Filed: Apr. 26, 2004

Related U.S. Application Data

(60) Continuation of application No. 10/298,700, filed on Nov. 18, 2002, now Pat. No. 6,727,548, which is a division of application No. 10/185,569, filed on Jun. 28, 2002, now Pat. No. 6,567,292.

(51) Int. Cl.[7] .................................... H01L 29/76
(52) U.S. Cl. .................. 257/345; 257/298; 257/314; 257/326
(58) Field of Search ................. 257/298, 314, 257/326, 345; 365/182

(56) References Cited

U.S. PATENT DOCUMENTS

| | | |
|---|---|---|
| 3,558,736 A | 6/1971 | McGroddy |
| 3,903,542 A | 12/1975 | Nathanson et al. |
| 3,974,486 A | 8/1976 | Curtis et al. |

(List continued on next page.)

FOREIGN PATENT DOCUMENTS

| | | |
|---|---|---|
| EP | 0747940 | 12/1996 |
| EP | 0747961 | 12/1996 |
| EP | 0655788 | 1/1998 |
| EP | 1050964 | 11/2000 |
| EP | 1085656 | 3/2001 |
| EP | 1107317 | 6/2001 |
| EP | 0526897 | 11/2001 |
| EP | 1168456 | 1/2002 |
| EP | 1204146 | 5/2002 |
| JP | 8018033 | 1/1996 |
| JP | 20011015757 | 1/2001 |
| WO | WO 90/03646 | 4/1990 |
| WO | WO 99/63598 | 4/1999 |
| WO | WO 00/41309 | 7/2000 |
| WO | WO 01/65597 | 9/2001 |
| WO | WO 01/69607 | 9/2001 |
| WO | WO 01/88977 | 11/2001 |
| WO | WO 01/99153 | 12/2001 |

OTHER PUBLICATIONS

Final Report: Smile MEL–ARI Project n°28741—Chapter V, pp. 184–194.

News Release from www.eurekalert.org/releases/udel–udc–nflb.html,"UD Computer News: Future Looks Bright for Tunnel Diodes, Promising Faster, More Efficient Circuits," October 1, 1998, 4 pages.

P. S. Barlow, et al., "Negative differential output conductance of self–heated power MOSFETs," IEE Proceedings–I Solid–State and Electron Devices, vol. 133, Part I, No. 5, Oct. 1986, pp. 177–179.

E. Chan, et al., "Compact Multiple–Valued Multiplexers Using Negative Differential Resistance Devices," IEEE Journal of Solid–State Circuits, vol. 31, No. 8, Aug. 1996, pp. 1151–1156.

(List continued on next page.)

*Primary Examiner*—Richard Elms
*Assistant Examiner*—Doug Menz
(74) *Attorney, Agent, or Firm*—J. Nicholas Gross

(57) ABSTRACT

An active negative differential resistance element (an NDR FET) and a memory device (such as an SRAM) using such elements is disclosed Soft error rate (SER) performance for NDR FETs and such memory devices are enhanced by adjusting a location of charge traps in a charge trapping layer that is responsible for effectuating an NDR behavior. Both an SER and a switching speed performance characteristic can be tailored by suitable placement of the charge traps.

16 Claims, 3 Drawing Sheets

U.S. PATENT DOCUMENTS

| | | | |
|---|---|---|---|
| 4,047,974 A | | 9/1977 | Harari |
| 4,143,393 A | | 3/1979 | DiMaria et al. |
| 4,503,521 A | * | 3/1985 | Schick et al. ............... 365/182 |
| 4,644,386 A | | 2/1987 | Nishizawa et al. |
| 4,806,998 A | | 2/1989 | Vinter et al. |
| 4,945,393 A | | 7/1990 | Beltram et al. |
| 5,021,841 A | | 6/1991 | Leburton et al. |
| 5,023,836 A | | 6/1991 | Mori |
| 5,032,891 A | | 7/1991 | Takagi et al. |
| 5,084,743 A | | 1/1992 | Mishra et al. |
| 5,093,699 A | | 3/1992 | Weichold et al. |
| 5,130,763 A | | 7/1992 | Delhaye et al. |
| 5,162,880 A | | 11/1992 | Hazama |
| 5,189,499 A | | 2/1993 | Izumi et al. |
| 5,357,134 A | | 10/1994 | Shimoji |
| 5,390,145 A | | 2/1995 | Nakasha et al. |
| 5,442,194 A | | 8/1995 | Moise |
| 5,448,513 A | | 9/1995 | Hu et al. |
| 5,455,432 A | | 10/1995 | Hartsell et al. |
| 5,463,234 A | | 10/1995 | Toriumi et al. |
| 5,477,169 A | | 12/1995 | Shen et al. |
| 5,523,603 A | | 6/1996 | Fishbein et al. |
| 5,543,652 A | | 8/1996 | Ikeda et al. |
| 5,552,622 A | | 9/1996 | Kimura |
| 5,606,177 A | | 2/1997 | Wallace et al. |
| 5,608,250 A | * | 3/1997 | Kalnitsky ................... 257/314 |
| 5,633,178 A | | 5/1997 | Kalnitsky |
| 5,689,458 A | | 11/1997 | Kuriyama |
| 5,698,997 A | | 12/1997 | Williamson, III et al. |
| 5,705,827 A | | 1/1998 | Baba et al. |
| 5,714,766 A | * | 2/1998 | Chen et al. ................... 257/17 |
| 5,732,014 A | | 3/1998 | Forbes |
| 5,754,477 A | * | 5/1998 | Forbes ................. 365/185.33 |
| 5,761,114 A | | 6/1998 | Bertin et al. |
| 5,770,958 A | | 6/1998 | Arai et al. |
| 5,773,996 A | | 6/1998 | Takao |
| 5,798,965 A | | 8/1998 | Jun |
| 5,804,475 A | | 9/1998 | Meyer et al. |
| 5,843,812 A | | 12/1998 | Hwang |
| 5,869,845 A | | 2/1999 | Van der Wagt et al. |
| 5,883,549 A | | 3/1999 | De Los Santos |
| 5,883,829 A | * | 3/1999 | van der Wagt ............. 365/159 |
| 5,895,934 A | | 4/1999 | Harvey et al. |
| 5,903,170 A | | 5/1999 | Kulkarni et al. |
| 5,907,159 A | | 5/1999 | Roh et al. |
| 5,936,265 A | | 8/1999 | Koga |
| 5,945,706 A | | 8/1999 | Jun |
| 5,953,249 A | | 9/1999 | Van der Wagt |
| 5,959,328 A | | 9/1999 | Krautschneider et al. |
| 5,962,864 A | | 10/1999 | Leadbeater et al. |
| 6,015,739 A | | 1/2000 | Gardner et al. |
| 6,015,978 A | | 1/2000 | Yuki et al. |
| 6,075,265 A | | 6/2000 | Goebel et al. |
| 6,077,760 A | | 6/2000 | Fang et al. |
| 6,084,796 A | | 7/2000 | Kozicki et al. |
| 6,091,077 A | | 7/2000 | Morita et al. |
| 6,097,036 A | | 8/2000 | Teshima et al. |
| 6,104,631 A | | 8/2000 | El-Sharawy et al. |
| 6,128,216 A | | 10/2000 | Noble, Jr. et al. |
| 6,130,559 A | | 10/2000 | Balsara et al. |
| 6,150,242 A | | 11/2000 | Van der Wagt et al. |
| 6,184,539 B1 | | 2/2001 | Wu et al. |
| 6,205,054 B1 | | 3/2001 | Inami |
| 6,222,766 B1 | | 4/2001 | Sasaki et al. |
| 6,225,165 B1 | | 5/2001 | Noble, Jr. et al. |
| 6,243,300 B1 | * | 6/2001 | Sunkavalli ............. 365/185.29 |
| 6,246,606 B1 | | 6/2001 | Forbes et al. |
| 6,261,896 B1 | | 7/2001 | Jun |
| 6,285,055 B1 | * | 9/2001 | Gosain et al. ............... 257/317 |
| 6,294,412 B1 | | 9/2001 | Krivokapic |
| 6,301,147 B1 | | 10/2001 | El-Sharawy et al. |
| 6,303,942 B1 | | 10/2001 | Farmer |
| 6,310,799 B2 | * | 10/2001 | Duane et al. ............... 365/159 |
| 6,353,251 B1 | | 3/2002 | Kimura |
| 6,396,731 B1 | | 5/2002 | Chou |
| 6,404,018 B1 | | 6/2002 | Wu et al. |
| 6,424,174 B1 | | 7/2002 | Nowak et al. |
| 6,434,053 B1 | * | 8/2002 | Fujiwara ................ 365/185.28 |
| 6,479,348 B1 | * | 11/2002 | Kamal et al. ............... 438/258 |
| 6,531,735 B1 | * | 3/2003 | Kamigaki et al. .......... 257/324 |
| 6,541,326 B2 | * | 4/2003 | Fujiwara ..................... 438/211 |
| 2001/0005327 A1 | | 6/2001 | Duane et al. |
| 2001/0013621 A1 | | 8/2001 | Nakazato |
| 2001/0019137 A1 | | 9/2001 | Koga et al. |
| 2001/0024841 A1 | | 9/2001 | Nobler Jr. et al. |
| 2001/0053568 A1 | | 12/2001 | Deboy et al. |
| 2002/0017681 A1 | | 2/2002 | Inoue |
| 2002/0048190 A1 | | 4/2002 | King |
| 2002/0054502 A1 | | 5/2002 | King |
| 2002/0057123 A1 | | 5/2002 | King |
| 2002/0063277 A1 | | 5/2002 | Ramsbey |
| 2002/0066933 A1 | | 6/2002 | King |
| 2002/0067651 A1 | | 6/2002 | King |
| 2002/0076850 A1 | | 6/2002 | Sadd et al. |
| 2002/0093030 A1 | | 7/2002 | Hsu et al. |
| 2002/0096723 A1 | | 7/2002 | Awaka |
| 2002/0100918 A1 | | 8/2002 | Hsu et al. |
| 2002/0109150 A1 | | 8/2002 | Kajiyama |

OTHER PUBLICATIONS

E. Chan, et al., "Mask Programmable Multi–Valued Logic Gate Arrays Using RTDs and HBTs," IEE Proceedings–E: Computers and Digital Techniques, vol. 143, No. 5, Oct. 1996, pp. 289–294.

Deen, Jamal (editor) et al., excerpt from "CMOS RF modeling, characterization and applications," World Scientific, Apr. 2002, 34 pages.

Dozsa, L. et al., "A transient method for measuring current–voltage characteristics with negative differential resistance regions," Research Institute for Technical Physics, P. O. Box 76, H–1325 Budapest, Hungary, (Received Jul. 24, 1997; accepted Aug. 1, 1997), 2 pages.

Gardner, Carl, Ringhofer, Christian, "Smooth Quantum Hydrodynamic Model Simulation of the Resonant Tunneling Diode," Dept. Of Mathematics Arizona State University, pp. 1–5(1998).

Geppert, Linda, "Quantum transistors: toward nanoelectronics," IEEE Spectrum, Sep. 2000, pp. 46–51.

Goldhaber–Gordon, David et al., "Overview of nanoelectronic devices," Proc. IEEE, 85(4), Apr. 1997, pp. 521–540.

Alejandro F. Gonzalez, et al., "Standard CMOS Implementation of a Multiple–Valued Logic Signed–Digit Adder Based on Negative Differential–Resistance Devices," Proceedings of the 30th IEEE International Symposium on Multiple–Valued Logic (ISMVL 2000), 6 pages.

HADDAB, Y. et al., "Quantized current jumps in silicon photoconductors at room temperature," J. Appl. Phys. 86 (7), Oct. 1, 1999, pp. 3787–3791.

G. I. Haddad et al., "Tunneling Devices and Applications in High Functionality/Speed Digital Circuits," Solid State Electronics, vol. 41, No. 10, Oct. 1997, pp. 1515–1524.

Hansch, W. et al., "The planar–doped–barrier–FET: MOSFET overcomes conventional limitations," ESSDERC'97 27th European Solid–State Device Research Conference, Stuttgart, Sep. 22–24 1997, 4 pages.

C. P. Heij, et al., "Negative Differential Resistance Due to Single–Electron Switching," Applied Physics Letters, vol. 74, No. 7, Feb. 15, 1999, 5 pages.

Jungel, A, Pohl, C., "Numerical Simulation of Semiconductor Devices: Energy–Transport and Quantum Hydrodynamic Modeling," Fachbereich Math., Tech. Univ. Berlin, Germany, pp. 1–9, 1998.

Karna, Shashi P. et al., "Point defects In SI–SIO2 systems: current understanding," Published in G. Pacchioni et al. (eds.), "Defects in SiO2 and related dielectrics: science and technology," Kluwer Academic Publishers, p. 599–615, (2000), 19 pages.

King, Tsu–Jae et al., U.S. Appl. No. 09/602,658, entitled "CMOS Compatible Process for Making a Tunable Negative Differential Resistance (NDR) Device," filed Jun. 22, 2000, 33 pages.

King, Tus–Jae et al., U.S. Appl. No. 09/603,101, entitled "CMOS–Process Compatible, Tunable NDR (Negative Differential Resistance) Device and Method of Operating Same," filed Jun. 22, 2000, 34 pages.

King, Tsu–Jae et al., U.S. Appl. No. 09/603,102, entitled "Charge Trapping Device and Method for Implementing a Transistor having a Negative Differential Resistance Mode," filed Jun. 22, 2000, 39 pages.

S. J. Koester, et al., "Negative Differential Conductance in Lateral Double–Barrier Transistors Fabricated in Strained Si Quantum Wells," Applied Physics Letters, vol. 70, No. 18, May, 1997, pp. 2422–2424.

O. Le Neel, et al., "Electrical Transient Study of Negative Resistance In SOI MOS Transistors," Electronics Letters, vol. 26, No. 1, pp. 73–74, Jan. 1990.

S. Luryi and M. Mastrapasqua, "Light–emitting Logic Devices based on Real Space Transfer In Complementary InGaAs/InAIAs Heterostructures", in "Negative Differential Resistance and Instabilities in 2D Semiconductors", ed. by N. Balkan, B. K. Ridley, and A. J. Vickers, NATO ASI Series [Physics] B 307, pp. 53–82, Plenum Press (New York 1993).

Serge Luryi and Mark Pinto, "Collector–Controlled States and the Formation of Hot Electron Domains in Real–Space Transfer Transistors," AT&T Bell Laboratories, pp. 1–7, 1992.

Serge Luryi and Mark Pinto, "Collector–Controlled States in Charge Injection Transistors," SPIE–92 Symposium, pp. 1–12, 1992.

R. H. Mathews, et al., "A New RTD–FET Logic Family," Proceedings of the IEEE, vol. 87, No. 4, pp. 596–605, 1999.

P. Mazumder, et al., "Digital Circuit Applications of Resonant Tunneling Devices," Proceedings of the IEEE, vol. 86, No. 4, pp. 664–686, Apr. 1998.

S. Mohan, et al., "Logic Design Based on Negative Differential Resistance Characteristics of Quantum Electronic Devices," IEE Proceedings–G: Electronic Devices, vol. 140, No. 6, Dec. 1993, pp. 383–391.

S. Mohan, et al., "Ultrafast Pipelined Adders Using Resonant Tunneling Transistors," IEE Electronics Letters, vol. 27, No. 10, May 1991, pp. 830–831.

S. Mohan, et al., "Ultrafast Pipelined Arithmetic Using Quantum Electronic Devices," IEE Proceedings–E: Computers and Digital Techniques, vol. 141, No. 2, Mar. 1994, pp. 104–110.

Farid Nemati et al., "A Novel High Density, Low Voltage SRAM Cell With a Vertical NDR Device," Center for Integrated Systems, Stanford University, CA, (2 pages).

Farid Nemati et al., "A Novel Thyristor–based SRAM Cell (T–RAM) for High–Speed, Low–Voltage, Giga–scale Memories," Center for Integrated Systems, Stanford University, CA, (4 pages).

S.M.A. Nimour, R. Ouasti, N. Zekri, "Effect of Spatially Disordered Barriers on the Band Structure of Finite Superlattices," phys. stat. sol. (b) 1998, 209, No. 2, 311–318.

R. Oberhuber, et al., "Tunnel–Devices with Negative Differential Resistivity Based on Silicon?," Source: Deutsche Forschungsgemelnschaft and Siemens AG, date unknown, 2 pages.

C. Pacha, et al., "Resonant Tunneling Device Logic Circuits," Microelectronics Advanced Research Initiative (MEL–ARI,) Jul. 1998–Jul. 1999, pp. 1–22.

C. Pacha and K. Goser, "Design of Arithmetic Circuits using Resonant Tunneling Diodes and Threshold Logic," Lehrstuhl Bauelemente der Elektrotechnik, Universitat Dortmund, pp. 1–11, Sep. 1997.

S. L. Rommel, et al., "Room Temperature Operation of Epitaxially Grown Si/Si0.5Ge0.5/Sl Resonant Interband Tunneling Diodes," Applied Physics Letters, vol. 73, No. 15, pp. 2191–2193, 1998.

Scoffield, John H. et al., "Reconciliation of different gate–voltage dependencies of 1/f noise in n–MOS and p–MOS transistors," IEEE Trans. Electron. Dev. 41, (11), 11 pgs.

A. Seabaugh, "Promise of Tunnel Diode Integrated Circuits," Tunnel Diode and CMOS/HBT Integration Workshop, Dec. 9, 1999, Naval Research Laboratory, Washington, DC., 13 Pages.

Seabaugh A., Brar B., Broekaert T., Morris F., and Frazier G., "Resonant Tunneling Mixed Signal Circuit Technology," Solid–State Electronics 43:1355–1365, 1999.

Seabaugh, A. et al., "Tunnel–Diode IC,"Minneapolis, Oct. 2, 2001, 23 pages.

Shao, Z., Porod, W., Lent, C., & Kirkner, D., "Transmission Zero Engineering in Lateral Double–Barrier Resonant Tunneling Devices," Dept. Of Electrical Engineering, University of Notre Dame, pp. 1–7 (1996).

Shoucair F. et al., "Analysis and Simulation of Simple Transistor Structures Exhibiting Negative Differential Resistance," EECS Department, UC Berkeley, Berkeley CA, (4 pages).

J. P. Sun, et al., "Resonant Tunneling Diodes: Models and Properties," Proceedings of the IEEE, vol. 86, No. 4, Apr. 1998, pp. 641–661.

J. P. A. Van Der Wagt, "Tunneling–Based SRAM," Proceedings of the IEEE, vol. 87, No. 4, pp. 571–595, 1999.

J. P. A. Van Der Wagt, et al., "RTD/HFET Low Standby Power SRAM Gain Cell," Source: Corporate Research Laboratories, Texas Instruments, 1998, 4 pages.

Villa, S. et al., "Application of 1/f noise measurements to the characterization of near–interface oxide states in ULSI n–MOSFET's," Dipartimento di Elettronica e nformazione, Politecnico di Milano (Italy), 7 pages.

Wirth, G. et al., "Periodic transconductance oscillations in sub–100nm MOSFETs," ESSDERC'97 27th European Solid–State Device Research Conference, Stuttgart, Sep. 22–24,1997, 4 pages.

G. Wirth, et al., "Negative Differential Resistance in Ultrashort Bulk MOSFETs," IECON'99 Conference Proceedings, vol. 1, San Jose, 1999, S. 29–34.

Jian Fu Zhang, "Traps: Detrapping," Wiley Encyclopedia of Electrical and Electronics Engineering Online, Article Posting Date: Dec. 27, 1999, John Wiley & Sons, Inc., 4 Pages.

Jian Fu Zhang, "Traps: Effects of Traps and Trapped Charges on Device Performance," Wiley Encyclopedia of Electrical and Electronics Engineering Online, Article Posting Date: Dec. 27, 1999, John Wiley & Sons, Inc., 2 Pages.

Jian Fu Zhang, "Traps: Measurement Techniques," Wiley Encyclopedia of Electrical and Electronics Enfineering Online, Article Posting Date: Dec. 27, 1999, John Wiley & Sons, Inc., 5 Pages.

Jian Fu Zhang, "Traps: Origin of Traps," Wiley Encyclopedia of Eletrical and Electronics Engineering Online, Article Posting Date: Dec. 27, 1999, John Wiley & Sons, Inc., 4 pages.

Jian Fu Zhang, "Traps: Trapping Kinetics," Wiley Encyclopedia of Electrical and Electronics Engineering Online, Article Posting Date: Dec. 27, 1999, John Wiley & Sons, Inc. 2 Pages.

Jian Fu Zhang, "Traps," Wiley Encyclopedia of Electrical and Electronics Engineering Online, Article Posting Date: Dec. 27, 1999, John Wiley & Sons, Inc., 2 Pages.

Zhang, J.F. et al., "A Comparative study of the electron trapping and thermal detrapping in SiO2 prepared by plasma and thermal oxidation," J. Appl. Phys. 72 (4), Aug. 15, 1992, pp. 1429–1435.

Zhang, J.F. et al., "A quantitative investigation of electron detrapping in SiO2 under Fowler–Nordheim stress," J. Appl. Phys. 71 (12), Jun. 15, 1992, pp. 5989–5996.

Zhang, J.F. et al., "Electron trap generation in thermally grown SiO2 under Fowler–Nordhelm stress," J. Appl. Phys. 71 (2), Jan. 15, 1992, pp. 725–734.

* cited by examiner

US 6,861,707 B1

NEGATIVE DIFFERENTIAL RESISTANCE (NDR) MEMORY CELL WITH REDUCED SOFT ERROR RATE

CROSS REFERENCE TO RELATED APPLICATIONS

The present application claims priority to and is a continuation of application Ser. No. 10/298,700, Nov. 18, 2002 entitled Negative Differential Resistance (NDR) Element & Memory with Reduced Soft Error Rate, now U.S. Pat. No. 6,727,548 which in turn is a divisional of Ser. No. 10/185,569 filed Jun. 28, 2002, now U.S. Pat. No. 6,567,292, both of which are hereby incorporated by reference as if fully set forth herein.

FIELD OF THE INVENTION

This invention generally relates to semiconductor memory devices and technology, and in particular to negative differential resistance (NDR) elements and static random access memory (SRAM) devices that utilize the same.

BACKGROUND OF THE INVENTION

A new type of FET and SRAM device using the same (NDR FETs) is described in detail in a patent application Ser. No. 10/029,077 filed Dec. 21, 2001 assigned to the present assignee, and published on May 9, 2002 as Publication No. 2002/0054502. The NDR FET structure, operation and method of making the same are discussed in detail in patent application Ser. No. 09/603,101 filed Jun. 22, 2000 by King et. al., which is also assigned to the present assignee. Such details are also disclosed in a corresponding PCT application PCT/USO1/19825 which was published as publication No. WO 01/99153 on Dec. 27, 2001. The above materials are hereby incorporated by reference.

As is well known, soft errors in memory devices are caused by, among other things, cosmic rays (neutrons), and alpha particles present in semiconductor materials and packaging. In typical SRAMs, the failure rate attributable to soft-errors (the so-called soft-error rate —SER) is measured by a metric known as Failures In Time (FIT); the basic unit of this benchmark refers to a malfunction occurrence frequency, where 1 FIT represents one malfunction every one billion hours (approximately 100,000 years) per device. For a conventional SRAM operating under normal conditions an FIT value of up to several thousand is considered adequate, and a value of less than approximately 1000 FIT/Mbit is preferable for embedded memory applications. In some applications more stringent requirements may be needed (i.e, on the order of 10–100 FIT/Mbit).

Soft errors can also influence SRAM embodiments which use NDR devices. Thus there is clearly a need for NDR FET and an NDR FET based SRAM device that have superior soft error characteristics.

SUMMARY OF THE INVENTION

An object of the present invention is to provide a memory device such as a static random access memory (SRAM) cell which utilizes NDR FETs, and which has improved soft error rate (SER) performance.

A first aspect of the invention concerns a method of forming a semiconductor field effect transistor (FET) for a memory device, the FET having a control gate, a source region, and a drain region. This method includes generally the following steps: forming a channel for carrying a current between the source and drain regions; and forming a trapping layer located proximate to and forming an interface with the channel. The trapping layer includes trapping sites adapted for trapping at least warm carriers from the channel so as to effectuate a negative differential resistance mode for the FET. To tailor characteristics of the FET, including an operational switching speed for the FET, the trapping sites are also tailored. In other words, the FET speed is directly related to a distance which the trapping sites are located from the interface, such that locating the trapping sites at a distance D1 results in a maximum operational switching speed S1, and such that locating the trapping sites at a distance D2 (D2>D1) results in a minimum operational switching speed S2 (S2<S1). Thus, the trapping sites are distributed within the trapping layer at an approximate distance D (D2>D>D1) in accordance with a target operational switching speed S for the FET (S1>S>S2) and a target soft error rate for the memory device.

DETAILED DESCRIPTION OF THE INVENTION

As noted earlier, FIG. 1 is a circuit diagram of a preferred embodiment of a static memory (SRAM) cell 105 consisting of two NDR elements 102, 103 which form a bistable latch 104 and one enhancement-mode IGFET access element 101.

Figure 1:
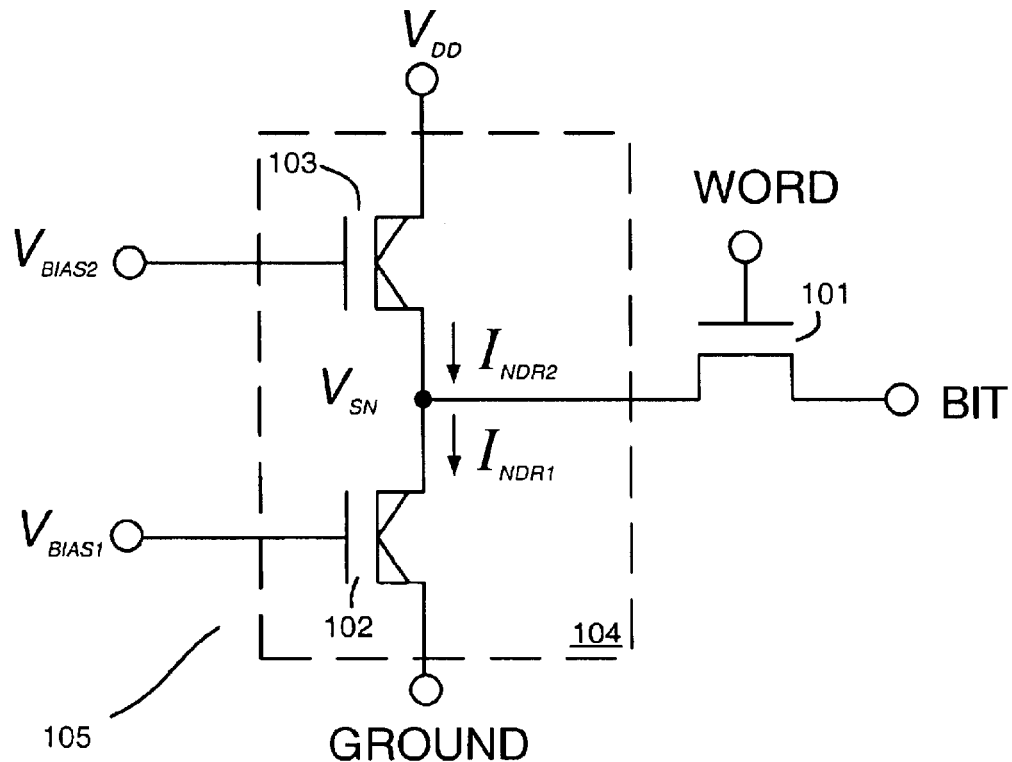
FIG. 1 is a circuit diagram of a preferred embodiment of a static random access memory (SRAM cell consisting of the combination of two NDR-FET elements which form a bistable latch and one n-channel enhancement-mode IGFET access element.
Figure 2:
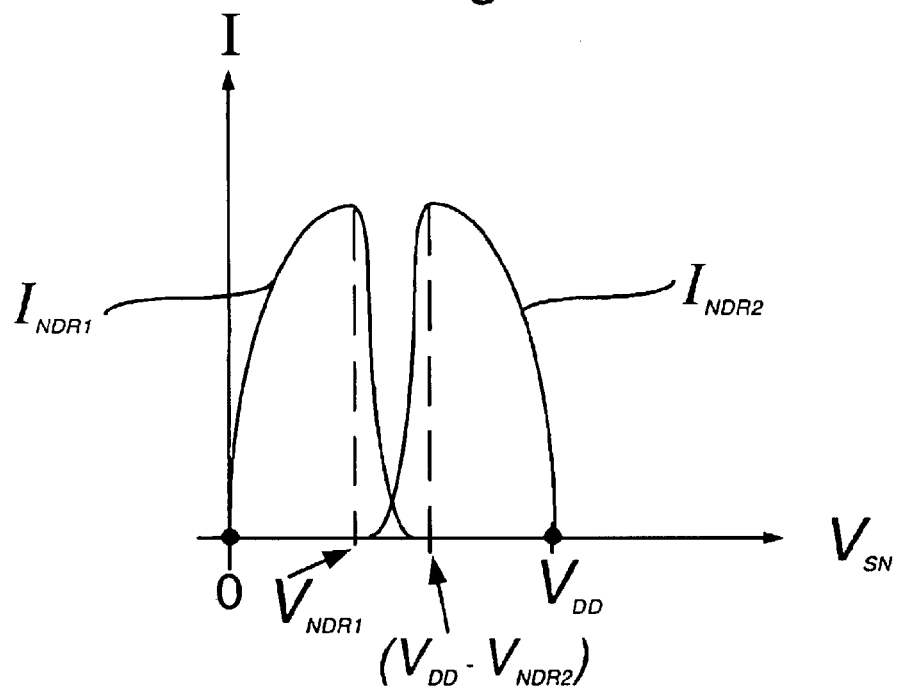
FIG. 2 is a plot of the current-vs.-voltage characteristic of the bistable latch formed by the combination of two NDR-FETs as shown in FIG. 1.

FIG. 2 is a current-vs.-voltage plot illustrating the operational characteristics of the static memory cell 105 of FIG. 1.

NDR elements 102, 103 of the present invention are preferably an NDR FET of the type referred to above in the aforementioned King et al. applications and constructed in accordance with such teachings except as noted below. The details of the same are provided for example in the aforementioned applications, and such documents are incorporated by reference herein primarily for the purpose of providing non-essential background information on representative types of environments in which the present inventions can be practiced.

The SRAM cell using NDR FETs described in application Ser. No. 10/029,077 is already believed to have superior SER performance over prior art SRAM cells due to its unique architecture and physical operation. This SRAM cell is particularly advantageous for embedded SRAM applications, which are becoming more and more critical for system on chip (SOC) devices.

Nonetheless, to achieve even better SER performance, the inventor has determined that the structure and manufacture of the basic NDR FETs 102,103 used in the embodiment of FIG. 1 can be tailored to create different distributions of the charge traps (which assist in bringing about an NDR characteristic). Thus, for any particular desired design or needed performance characteristic, both a switching benchmark and an error benchmark can be controlled. While the description herein is presented in the context of a conventional bulk silicon based memory cell, it will be understood by those skilled in the art that the present teachings could also be exploited in so-called Silicon on Insulator (SOI) based SRAM cells. The advantages of SOI technology include the fact that the SER is generally lower as compared with bulk-Si technology because of the overall reduced p-n junction sizes.

Figure 3A:
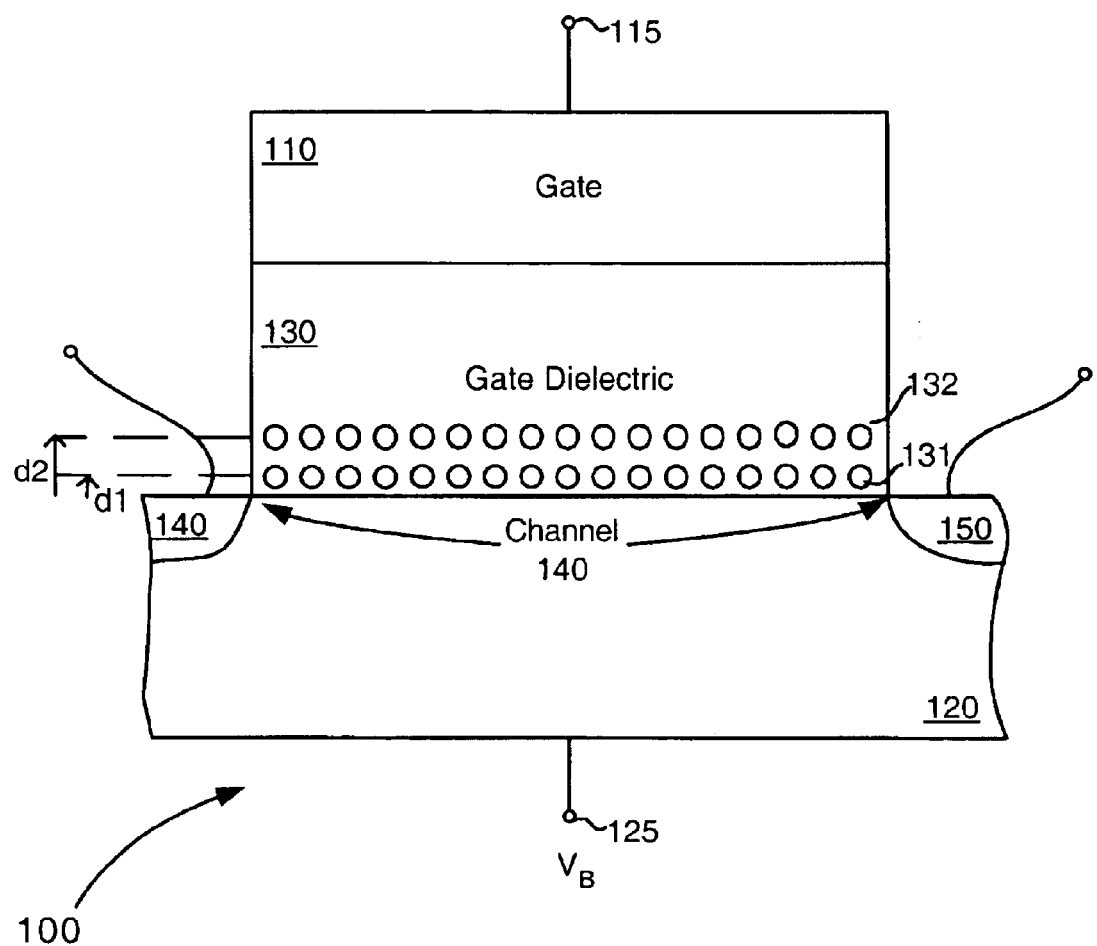
FIG. 3A is a schematic cross-sectional view of an NDR FET of a preferred embodiment of the present invention and which is preferably incorporated as one or both of the two NDR FET elements of the SRAM cell of FIG. 1.

As shown in FIG. 3A, the overall structure as shown in cross section of a preferred NDR FET 100 of the present invention is similar to that shown in the aforementioned Ser. No. 10/029,077 and includes generally a substrate 120 with a body bias terminal 125; a source region 140 (with a source terminal 145) coupled through a channel region 140 to a drain region 150 (with a drain terminal 155) by a channel region 140; a gate dielectric 130 and a gate electrode 110 connected to a bias signal through a gate terminal 115.

The primary difference, as described herein, is that the charge traps (131, 132) of the present invention are tailored to be placed at a particular location (or locations) in gate dielectric in accordance with a desired SER and switching speed for an NDR PET. It will be appreciated by those skilled in the art that the cross section of FIG. 3A is not to scale, and that certain features have been simplified and/or omitted to make the present discussion more germane to the claimed invention.

From theoretical calculations, simulations and experiments the inventor has determined that the speed of the NDR mechanism is directly related to, among other things, the trap density and physical location of the trap states: in other words, the farther the traps are from the interface (d2>d1) the slower the NDR mechanism. Preliminary data suggests that if charge traps are incorporated as a charge trap distribution 131—i.e., right at or very near the channel/dielectric interface i.e., d1 is almost 0) during a manufacturing process using a concentration (preferably Boron) greater than $1*10^{19}/cm^3$, then the switching speed (to go in/out of an NDR mode) is on the order of 1 picosecond. This concentration of Boron in fact yields a trap density of about $2*10^{14}/cm^2$ which is more than adequate for significant charge trapping behavior. However, if the charge traps are incorporated instead as a charge trap distribution 132—i.e., positioned slightly away from such interface (Le., about 1 nm into the dielectric as noted at d2) during a manufacturing process then the switching speed is on the order of 1 nanosecond. It will be understood of course that other alternative locations and distributions for the charge traps can be provided for NDR PET 100, and that locations d1 and d2 are merely representative. Moreover, for some applications it may be desirable to form distributions at more than one general location with different processing steps.

In any event, this mechanism limits the speed at which data can be written into an SRAM cell of the type shown in FIG. 1—i.e., the slower the NDR mechanism, the longer the write access time. From the above it can be seen that the switching speed can be controlled by a factor of 1000 or more simply by adjusting the traps to be distributed in locations 131 or 132.

Nonetheless, the inventor has also noted that one positive side effect of moving the charge traps farther from the semiconductor-insulator interface is that immunity to soft-errors increases concomitantly with the distance. The location of the traps can still be adapted to provide an extremely fast switching speed as may be required for a particular application.

Figure 3B:
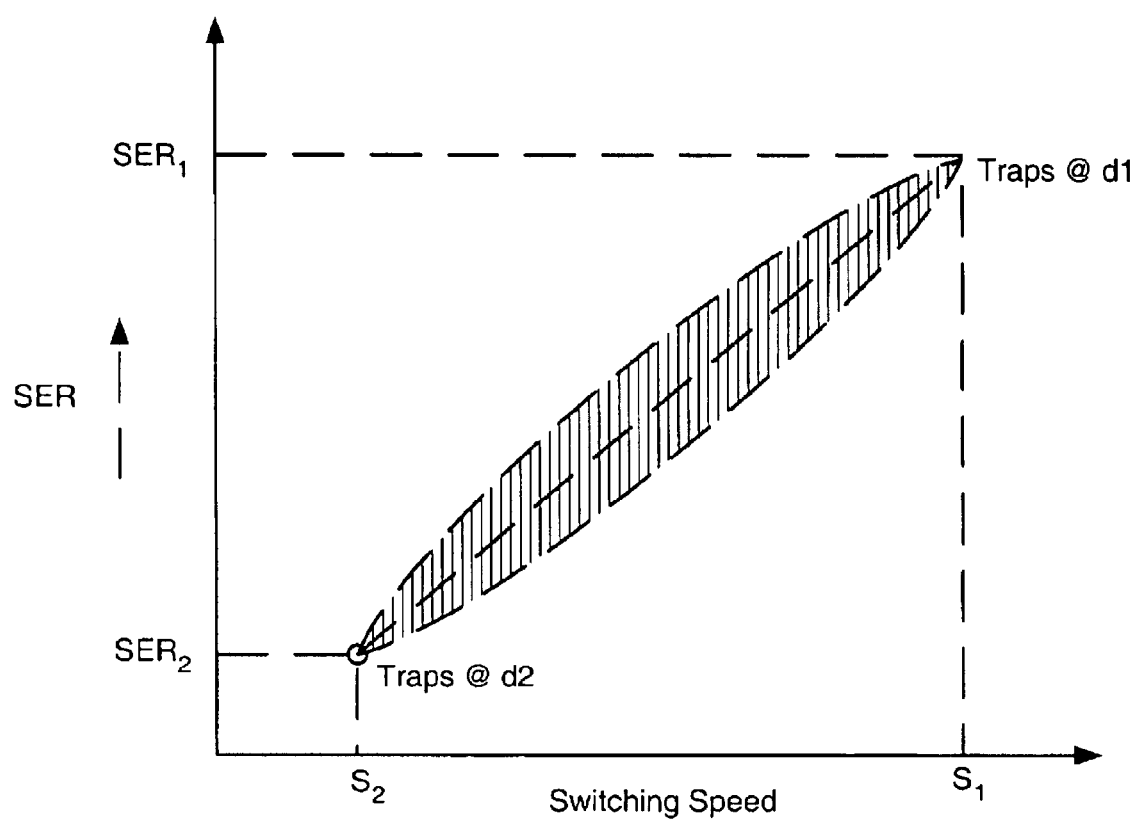
FIG. 3B is a graph generally illustrating a relationship between SER and switching speed for an NDR FET and NDR based SRAM device constructed in accordance with the present teachings.

This phenomenon is illustrated basically in the graph of FIG. 3B, which for a particular switching speed (S1) there is a corresponding soft error rate (SER1), and for a lower switching speed (S2) there is a corresponding lower soft error rate (SER2). While the precise relationship between these parameters will vary, it is expected nonetheless that it should be roughly linear as shown, or at least its form easily determinable for any particular set of given process parameters without undue experimentation.

Accordingly, for any particular design and process, both a switching benchmark and an error benchmark can be satisfied through routine modeling and testing. Where it is appropriate, a trade-off between fast write speed and high immunity to soft-errors can be tailored by adjusting the fabrication process to adjust the physical location of the charge traps. The specific location of the traps to achieve a particular SER benchmark and write speed benchmark will vary of course based on geometry, process variations, and desired performance characteristics.

To actually distribute the traps in a particular location and with a particular concentration, the teachings of the aforementioned King et al applications can be used, in which the energy and concentration of an ion implant (preferably Boron) into the channel region are adjusted through any conventional means. For example, an implant of Boron at 20 KeV and at 2 to $3*10^{14}/cm^2$ into channel region 140 results in an acceptable concentration of charge traps into the trapping layer 130 as noted above and with the requisite amount of energy. In a preferred approach, the traps have an energy preferably about 0.5 eV above a conduction band edge of channel 140 so that it is not necessary for the electrons in the channel to be "hot," but rather only slightly energized, or "warm" to be trapped. This further ensures that they easily de-trapped as well. The traps are incorporated into a channel/dielectric interface region and the bulk of gate dielectric layer 130 through the process of forming the latter using conventional gate oxidation processes as explained in the former King et al application. Thus, by controlling how they are initially implanted into channel region 140, the final distribution and location of the traps is also determined within trapping layer 130.

In another variation, trapping sites are located along only a limited portion of the channel/dielectric layer interface. In other words, the channel implant is masked to ensure that only a portion of dielectric layer 130 (m the horizontal direction parallel to channel 140) includes traps, and thus a trapping mechanism will only occur in such region. For some applications for example it may be desirable to have a trapping activity occur closer to a source region than a drain region, as this avoids trapping hot carriers (generated excessively on the drain side) and thus it makes it more easy to control a threshold voltage of NDR FET 100.

Finally, the inventor has discovered that there is another reason why it is desirable to try to keep the traps confined to the channel/dielectric interface region. Namely, if the dopant concentration is too high in gate dielectric layer 130, this can result in unacceptable leakage characteristics. To prevent the traps from achieving a high concentration in the bulk of the remainder of trapping layer 130, a variety of different techniques can be used. For example, a rapid thermal anneal (RTA) step (or an equivalent heat treatment step) tends to minimize such diffusion by annealing out implantation induced defects (after the channel region is implanted), and thus is preferable for most applications. Thus the traps can be further manipulated and distributed by adjusting a time, temperature, or ramping characteristic of such heat process.

Alternatively the trapping layer 130 can be formed as two separate dielectric layers, such as a deposited SiO2 layer followed by a thermally grown SiO2 layer. Other materials are also possible, of course, including mixtures of SiN, SiON, etc. The traps are then primarily distributed only at the channel interface, within the deposited SiO2 layer and an interface with the thermal SiO2 layer. Yet another variation would be to directly implant the charge traps into a particular location and concentration only after channel region 140 and gate dielectric layer 130 are formed.

Other techniques will be apparent to those skilled in the art, and the present invention is not limited by such considerations. Accordingly, the particular details can be determined for any particular architecture and can be implemented in the sane in silicon form with conventional techniques known to those skilled in the art, such as through routine simulations, process experiments, etc.

Thus for 6-T SRAM technologies below 0.13 um, where soft-error rate is emerging as a very serious problem in embedded applications, this aspect of the invention can be exploited to form embedded soft-error rate optimized SRAMs. Conventional error-correction techniques can also be supplementally employed with such embodiments to bring the overall FIT rate to acceptable levels.

Other embodiments of the same will be apparent from the present teachings, and the present invention is by no means limited to the examples herein. Other supporting structures may also be incorporated within an SRAM cell 105 as operational elements, including NDR diodes. In such instances, only one NDR FET may be used, and only such NDR FET may require trap tailoring.

While the invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments. While such claims have been formulated based on the particular embodiments described herein, it should be apparent the scope of the disclosure herein also applies to any novel and non-obvious feature (or combination thereof) disclosed explicitly or implicitly to one of skill in the art, regardless of whether such relates to the claims as provided below, and whether or not it solves and/or mitigates all of the same technical problems described above. Finally, the applicants further reserve the right to pursue new and/or additional claims directed to any such novel and non-obvious features during the prosecution of the present application (and/or any related applications).

What is claimed is:

1. A memory cell comprising:
    a data transfer element adapted to facilitate a read operation or a write operation involving a storage node of the memory cell; and
    a first negative differential resistance (NDR) element coupled to said data transfer element, said storage node and a first voltage potential, wherein said first NDR element is adapted to operate with a first NDR characteristic between said storage node and said first voltage potential; and
    a second NDR element coupled to said first NDR element, said data transfer element, said storage node and a second voltage potential wherein said second NDR element is adapted to operate with a second NDR characteristic between said storage node and said second voltage potential;
    said first NDR element and said second NDR element both including a trap layer in which charge traps are used to effectuate said first NDR characteristic and said second NDR characteristics;
    wherein said charge traps are distributed in said trap layer so as to cause the memory cell to achieve a soft error rate of approximately 1,000 failures-in-time (FITs)/Mbit or less.

2. The memory device cell of claim 1, wherein said memory device is a static random access memory (SRAM) cell.

3. The memory flee cell of claim 1, wherein said first NDR element and said second NDR element are NDR-capable FETs.

4. The memory cell of claim 3, wherein said charge traps are distributed in said trap layer so as to NDR-capable FETs to switch with a switching speed between 1 picosecond and 10 nanoseconds.

5. The memory cell of claim 1, wherein said charge traps are formed by a doping impurity including Boron.

6. The memory cell of claim 1, wherein said charge traps have a trap density of approximately 1 to $5*10^{14}$ traps/cm$^2$ at a distance of about 0.5 nm from an interface of said trapping layer with a channel of said first NDR element.

7. The memory cell of claim 1, wherein said charge traps have an energy level of about 0.5 eV about a conduction band edge of a channel of said first NDR element.

8. The memory cell of claim 1, wherein said trapping layer is comprised of two separate layers, including a first dielectric layer with a high concentration of said charge traps, and a second dielectric layer with a substantially smaller concentration of said charge traps.

9. The memory cell of claim 1, wherein said first NDR element and said second NDR element are located on a silicon on insulator (SOI) substrate.

10. The memory cell of claim 1, wherein the memory cell is embedded within a system on chip (SOC) device.

11. A memory cell comprising:
    a data transfer element adapted to transfer data to or from a storage node of the memory cell; and
    a first negative differential resistance (NDR) field effect transistor coupled to said data transfer element, said storage node and a first voltage potential, wherein said first NDR transistor is adapted to operate with a first NDR characteristic in a first channel region between said storage node and said first voltage potential; and
    a second NDR FET coupled to said first NDR FET, said data transfer element, said storage node and a second voltage potential wherein said second NDR element is adapted to operate with a second NDR characteristic in a second channel region between said storage node and said second voltage potential;
    said first NDR FET and said second NDR FET both including a common trap layer situated adjacent to said first channel region and said second channel region in which charge traps are used to effectuate said first NDR characteristic and said second NDR characteristics by trapping and de-trapping charge;

wherein said charge traps are distributed in said trap layer so as to enable said first NDR FET and said second NDR FET to switch to said first NDR characteristic and said second NDR characteristic respectively in about 1 picosecond, and to enable the the memory cell to achieve a soft error rate of approximately 1,000 failures-in-time (FITs)/Mbit or less.

12. The memory cell of claim 11, wherein said charge traps are formed by a doping impurity including Boron.

13. The memory cell of claim 11, wherein said charge traps have a trap density of approximately 1 to $5*10^{14}$ traps/cm$^2$ at a distance of about 0.5 nm from an interface of said trapping layer with said first channel region of said first NDR FET.

14. The memory cell of claim 11, wherein said trapping layer is comprised of two separate layers, including a first dielectric layer with a high concentration of said charge traps, and a second dielectric layer with a substantially smaller concentration of said charge traps.

15. The memory cell of claim 11, wherein said first NDR FET and said second NDR FET are located on a silicon on insulator (SOI) substrate.

16. The memory cell of claim 11, wherein the memory cell is embedded within a system on chip (SOC) device.

* * * * *

UNITED STATES PATENT AND TRADEMARK OFFICE
CERTIFICATE OF CORRECTION

PATENT NO. : 6,861,707 B1
DATED : March 1, 2005
INVENTOR(S) : Tsu-Jae King

It is certified that error appears in the above-identified patent and that said Letters Patent is hereby corrected as shown below:

Column 6,
Line 21, delete "device".
Line 24, delete "flee".

Column 7,
Line 9, delete "the" (second occurrence).

Signed and Sealed this

Thirty-first Day of May, 2005

JON W. DUDAS
*Director of the United States Patent and Trademark Office*